(12) United States Patent
Nguyen et al.

(10) Patent No.: US 7,253,078 B1
(45) Date of Patent: Aug. 7, 2007

(54) METHOD AND APPARATUS FOR FORMING AN UNDERFILL ADHESIVE LAYER

(75) Inventors: Luu T. Nguyen, Sunnyvale, CA (US); Hau T. Nguyen, San Jose, CA (US); Viraj A. Patwardhan, Sunnyvale, CA (US); Nikhil Kelkar, San Jose, CA (US); Shahram Mostafazadeh, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 13 days.

(21) Appl. No.: 10/224,291

(22) Filed: Aug. 19, 2002

Related U.S. Application Data

(63) Continuation-in-part of application No. 10/080,913, filed on Feb. 21, 2002, which is a continuation-in-part of application No. 09/359,214, filed on Jul. 22, 1999, now Pat. No. 6,352,881.

(51) Int. Cl.
*H01L 21/44* (2006.01)
(52) U.S. Cl. .................................... 438/411
(58) Field of Classification Search ........ 257/734–738, 257/E33.056; 438/108–116; 361/600, 720, 361/730, 734, 735
See application file for complete search history.

(56) References Cited

U.S. PATENT DOCUMENTS

| 5,008,189 | A | 4/1991 | Oroskar et al. |
| 5,128,746 | A | 7/1992 | Pennisi et al. |
| 5,136,365 | A | 8/1992 | Pennisi et al. |
| 5,214,308 | A | 5/1993 | Nishiguchi et al. |
| 5,244,143 | A | 9/1993 | Ference et al. |
| 5,250,843 | A | 10/1993 | Eichelberger |
| 5,329,423 | A | * 7/1994 | Scholz ...................... 361/760 |
| 5,376,403 | A | 12/1994 | Capote et al. |
| 5,495,439 | A | 2/1996 | Morihara |
| 5,500,534 | A | 3/1996 | Robinson et al. |
| 5,587,342 | A | 12/1996 | Lin et al. |
| 5,668,059 | A | 9/1997 | Christie et al. |
| 5,698,894 | A | 12/1997 | Bryant et al. |
| 5,736,456 | A | 4/1998 | Akram |
| 5,767,010 | A | 6/1998 | Mis et al. |

(Continued)

OTHER PUBLICATIONS

Kulicke & Soffa, "Flip Chip Division, Polymer Collar Wafer Level Package; Achieve Maximum Reliability for Wafer Level Packages!", Dec. 7, 2001, www.kns.com.

(Continued)

*Primary Examiner*—Nathan W. Ha
(74) *Attorney, Agent, or Firm*—Beyer Weaver LLP

(57) ABSTRACT

An apparatus and method for forming a layer of underfill adhesive on an integrated circuit in wafer form is described. In one embodiment, the layer of underfill adhesive is disposed and partially cured on the active surface of the wafer. Once the underfill adhesive has partially cured, the wafer is singulated. The individual integrated circuits or die are then mounted onto a substrate such as a printed circuit board. When the solder balls of the integrated circuit are reflowed to form joints with corresponding contact pads on the substrate, the underfill adhesive reflows and is completely cured. In an alternative embodiment, the underfill adhesive is fully cured after it is disposed onto the active surface of the wafer.

32 Claims, 7 Drawing Sheets

U.S. PATENT DOCUMENTS

| | | | |
|---|---|---|---|
| 5,768,290 | A | 6/1998 | Akamatsu |
| 5,773,359 | A | 6/1998 | Mitchell et al. |
| 5,872,633 | A | 2/1999 | Holzapfel et al. |
| 5,880,530 | A | 3/1999 | Mashimoto et al. |
| 5,895,976 | A | 4/1999 | Morrell et al. |
| 5,925,936 | A * | 7/1999 | Yamaji ............... 257/787 |
| 5,937,320 | A | 8/1999 | Andricacos et al. |
| 5,953,623 | A | 9/1999 | Boyko et al. |
| 5,977,632 | A | 11/1999 | Beddingfield |
| 6,023,094 | A | 2/2000 | Kao et al. |
| 6,060,373 | A | 5/2000 | Saitoh |
| 6,063,647 | A | 5/2000 | Chen et al. |
| 6,071,757 | A | 6/2000 | Fogal et al. |
| 6,100,114 | A * | 8/2000 | Milkovich et al. ........ 438/127 |
| 6,121,689 | A | 9/2000 | Capote et al. |
| 6,130,473 | A | 10/2000 | Mostafazadeh et al. |
| 6,171,887 | B1 | 1/2001 | Yamaji ............... 438/106 |
| 6,190,940 | B1* | 2/2001 | DeFelice et al. ........ 438/106 |
| 6,228,678 | B1 | 5/2001 | Gilleo et al. |
| 6,245,595 | B1 | 6/2001 | Nguyen et al. |
| 6,258,626 | B1* | 7/2001 | Wang et al. ........... 438/107 |
| 6,288,444 | B1 | 9/2001 | Abe et al. |
| 6,297,560 | B1 | 10/2001 | Capote et al. |
| 6,307,269 | B1 | 10/2001 | Akiyama et al. |
| 6,316,528 | B1 | 11/2001 | Iida et al. |
| 6,327,158 | B1 | 12/2001 | Kelkar et al. |
| 6,346,296 | B1 | 2/2002 | McCarthy et al. |
| 6,352,881 | B1 | 3/2002 | Nguyen et al. |
| 6,358,627 | B2 | 3/2002 | Benenati et al. |
| 6,372,547 | B2 | 4/2002 | Nakamura et al. |
| 6,391,683 | B1 | 5/2002 | Chiu et al. |
| 6,429,238 | B1 | 8/2002 | Sumita et al. |
| 6,455,920 | B2 | 9/2002 | Fukasawa et al. ........ 257/620 |
| 6,468,832 | B1 | 10/2002 | Mostafazadeh |
| 6,479,308 | B1 | 11/2002 | Eldridge |
| 6,486,562 | B1 | 11/2002 | Kato |
| 6,507,118 | B1 | 1/2003 | Schueller |
| 6,605,479 | B1 | 8/2003 | Pasadyn et al. |
| 6,649,445 | B1 | 11/2003 | Qi et al. |
| 6,683,379 | B2 | 1/2004 | Haji et al. |
| 6,791,194 | B1* | 9/2004 | Nagai et al. ........... 257/783 |
| 6,818,550 | B2 | 11/2004 | Shibata |
| 6,822,324 | B2 | 11/2004 | Tao et al. |
| 2002/0003299 | A1* | 1/2002 | Nakamura et al. ........ 257/734 |
| 2002/0014703 | A1 | 2/2002 | Capote et al. |
| 2002/0027257 | A1 | 3/2002 | Kinsman et al. |
| 2002/0031868 | A1* | 3/2002 | Capote et al. ........... 438/126 |
| 2002/0109228 | A1* | 8/2002 | Buchwalter et al. ....... 257/738 |
| 2002/0171152 | A1* | 11/2002 | Miyazaki ............. 257/778 |
| 2003/0001283 | A1* | 1/2003 | Kumamoto ............ 257/778 |
| 2003/0013233 | A1 | 1/2003 | Shibata |
| 2003/0080360 | A1 | 5/2003 | Lee et al. |
| 2003/0087475 | A1* | 5/2003 | Sterrett et al. .......... 438/108 |
| 2003/0099767 | A1* | 5/2003 | Fang ................. 427/96 |
| 2003/0127502 | A1 | 7/2003 | Alverez |
| 2003/0129789 | A1* | 7/2003 | Smith et al. ........... 438/127 |
| 2003/0169064 | A1 | 9/2003 | Pirkle et al. |
| 2003/0193096 | A1 | 10/2003 | Tao et al. |
| 2003/0218258 | A1* | 11/2003 | Charles et al. .......... 257/783 |
| 2004/0002181 | A1* | 1/2004 | Scheifers et al. ......... 438/124 |
| 2005/0156331 | A1* | 7/2005 | Akram ................ 257/781 |
| 2005/0212142 | A1* | 9/2005 | Miyazaki et al. ........ 257/779 |

OTHER PUBLICATIONS

Kulicke & Soffa, "Flip Chip Division, Polymer Collar Wafer Level Package; See the Polymer Collar WLP difference!", Dec. 7, 2001, www.kns.com.

"Fundamentals of Microsystem Packaging", Rao R. Tummala, Chapters 2, 10, and 17, (May 8, 2001) McGraw-Hill Professional Publishing; ISBN: 0071371699.

"Chip Scale Package: Design, Materials, Process, Reliability, and Applications", John H. Lau and S.W. Ricky Lee, Chapter 1, pp. 1-41, (Feb. 28, 1999) McGraw-Hill Professional Publishing, ISBN: 0070383049.

U.S. Appl. No. 10/080,913, filed Feb. 21, 2002.

"Polymer Collar WLP™, Wafer Level Package Family", © 2002, downloaded from www.kns.com/prodserv/PDFS/FCD/polymer_collar.pdf, 2 pages.

"Presenting Polymer Collar WLP™—A New Wafer Level Package for Improved Solder Joint Reliablility", © 2002, downloaded from www.kns.com/prodserv/flipchip/pdf/PC¯ad.pdf, 1 page.

Barret et al., Kulicke & Soffa, "Polymer Collar WLP™—A New Wafer Level Package for Improved Solder Joint Reliablility", © 2002, downloaded from www.kns.com/resources/articles/PolymerCollar.pdf, 9 pages.

Bogatin, Eric, "All Dressed Up and Nowhere to Go"; *Semiconductor International*, May 1, 2002, downloaded Dec. 23, 2003, from www.reed-electronics.com/semiconductor/index.asp?layout=article&articleid=CA213812&rid=0&rme=0&cfd=1, 2 pages.

Nguyen et al., "Effect of Underfill Fillet Configuration on Flip Chip Package Reliablitiy", SEMI® Technology Symposium: International Electronics Manufacturing Technology (IEMT) Symposium, SEMICON® West 2002.

Office Action mailed Apr. 11, 2005 in U.S. Appl. No. 10/707,208.

\* cited by examiner

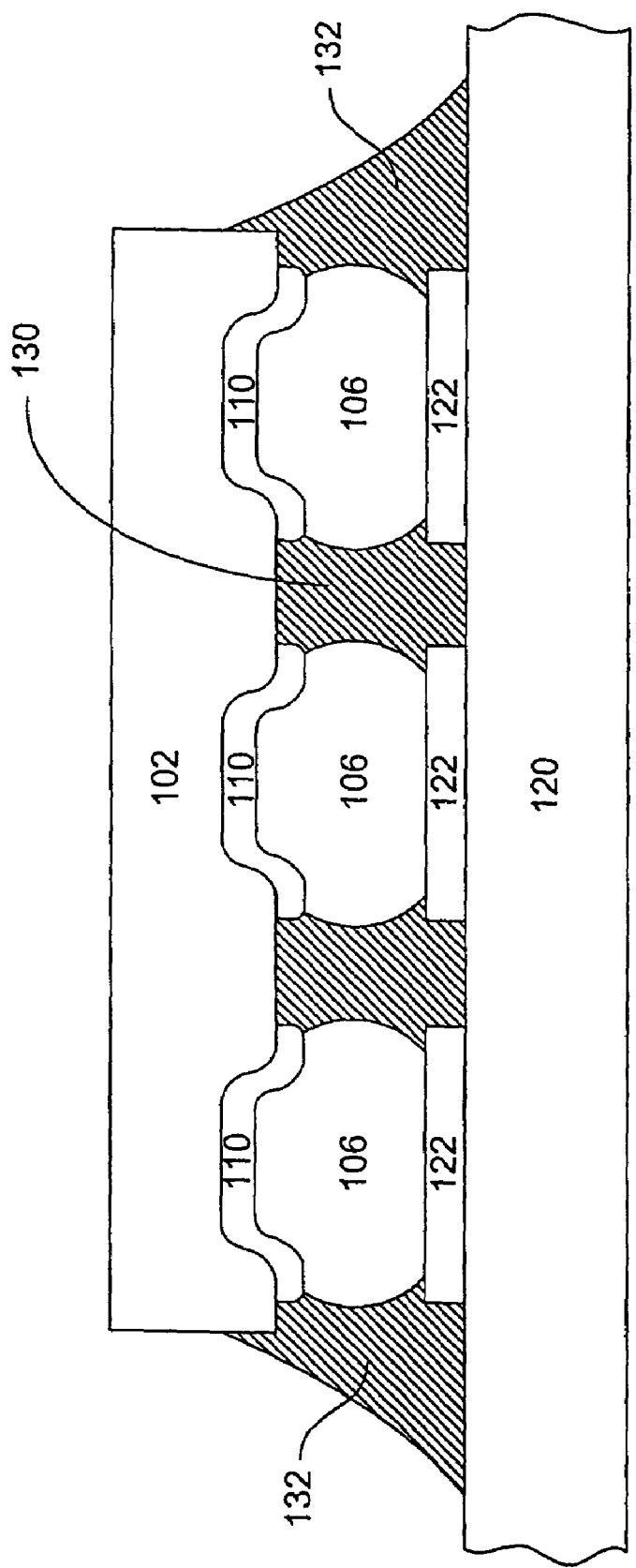

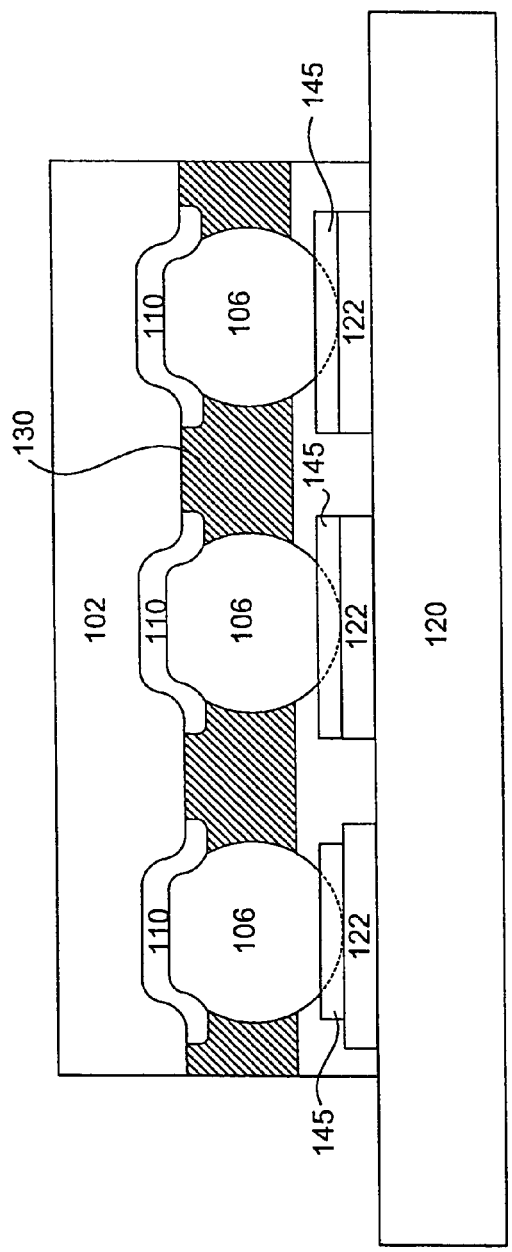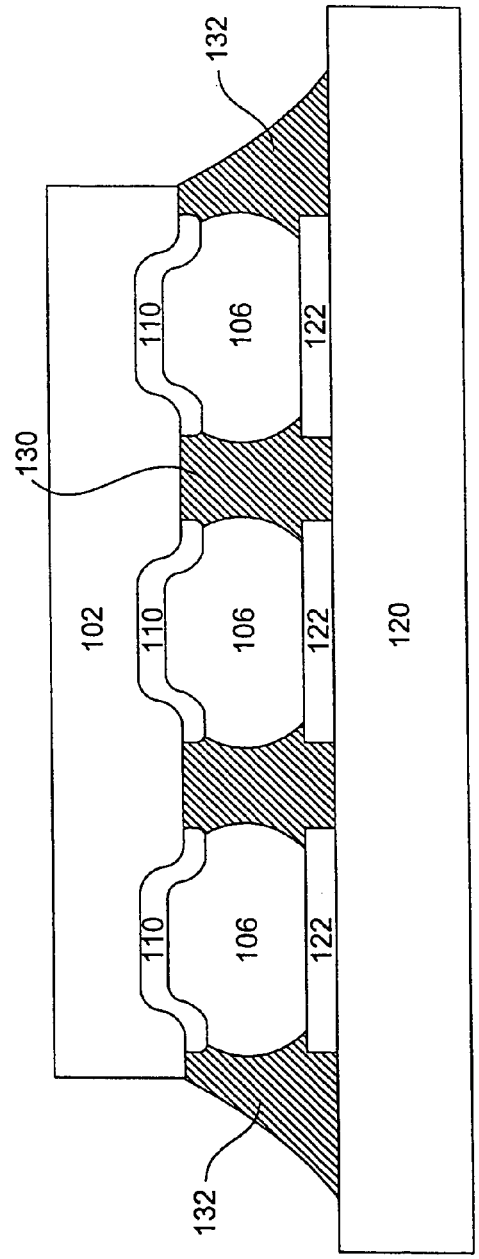

METHOD AND APPARATUS FOR FORMING AN UNDERFILL ADHESIVE LAYER

CROSS-REFERENCE TO RELATED APPLICATIONS

This application is a continuation-in-part of co-pending application Ser. No. 10/080,913 filed Feb. 21, 2002, which is a continuation-in-part of application Ser. No. 09/359,214, filed Jul. 22, 1999, now U.S. Pat. No. 6,352,881, both of which are incorporated herein by reference. This application is also related to U.S. Pat. No. 6,245,595 which is also incorporated herein by reference.

FIELD OF THE INVENTION

The present invention relates generally to a wafer level packaging process for integrated circuits. More particularly, the invention relates to various packaging arrangements wherein an underfill material is applied to a wafer prior to dicing.

BACKGROUND OF THE INVENTION

There are a number of conventional processes for packaging integrated circuits. One approach which is commonly referred to as "flip chip" packaging generally contemplates forming solder bumps (or other suitable contacts) directly on an integrated circuit die. The die is then "flipped" and attached to a substrate such as a printed circuit board or substrate. That is, the solder bumps on the die are aligned and mounted onto matching contacts on the substrate. The solder bumps are then reflowed to electrically connect the die to the substrate.

When a flip chip die is mounted to the substrate, an air gap typically remains between the die and substrate. This gap is commonly filled with material that is flowed into the gap in liquid form and is then solidified. This material is generally a mixture of a epoxy resin and small silica spheres and is often called underfill. The underfill material is typically applied in liquid form from a dispenser at one edge of the die. The material then flows into the narrow gap due to capillary action and spreads across the flip chip die until finally the entire area of the gap between the die and substrate is filled.

There are problems associated with this type of underfill process. For example, the operation of applying underfill must be repeated for each flip chip mounted onto a substrate. Repeating such an operation many times during manufacturing significantly increases costs. Also, as the underfill material flows past solder bumps to fill the gap, separation of silica spheres from resin may occur. The separation of silica spheres from the resin occurs as some silica spheres become trapped as they meet solder ball obstacles. The underfill material may therefore develop streaks of high and low silica concentration. The silica may also separate from the resin by sinking to one side of the gap, thus creating a silica rich side in the bottom and a resin rich side on the top of the gap. This segregation of silica and resin alters the mechanical properties of the filled region and thereby may mitigate the mechanical function of the underfill.

Although the described process works well, there is always a desire to provide more cost effective processes for packaging integrated circuits.

SUMMARY OF THE INVENTION

To achieve the foregoing and other objects and in accordance with the purpose of the present invention, an apparatus and method for forming a layer of underfill adhesive on an integrated circuit in wafer form is disclosed. In one embodiment, the layer of underfill adhesive is disposed and partially cured on the active surface of the wafer. Once the underfill adhesive has cured, the wafer is signulated. The individual integrated circuits or die are then mounted onto a substrate such as a printed circuit board. When the solder balls of the integrated circuit are reflowed to form joints with corresponding contact pads on the substrate, the underfill adhesive is completely cured. In an alternative embodiment, the underfill adhesive is fully cured after it is disposed onto the active surface of the wafer. In various other embodiments, the underflow adhesive is disposed onto the wafer using stencil printing, screen printing, molding, or a spin on deposition process. The underflow adhesive is selected from a group of materials including, but not limited to, epoxies, poly-imides, or silicone-polyimides copolymers and includes one or more of the following components: epoxy resin, a hardener, a catalyst initiator, a coloring dye and an inorganic filler.

BRIEF DESCRIPTION OF THE DRAWINGS

The features of the present invention may best be understood by reference to the following description of the presently preferred embodiments together with the accompanying drawings. For the sake of clarity the drawings are not to scale.

FIG. 4 illustrates a flip chip of the present invention mounted to a substrate such as a printed circuit board.

FIG. 5(b) is a cross sectional side view of a die taken from the wafer of FIG. 5(a) mounted on a substrate having solder paste thereon.

FIG. 5(c) is a cross sectional side view of the die of FIG. 5(b) after reflowing the solder bumps.

DETAILED DESCRIPTION OF THE INVENTION

Figure 1A:
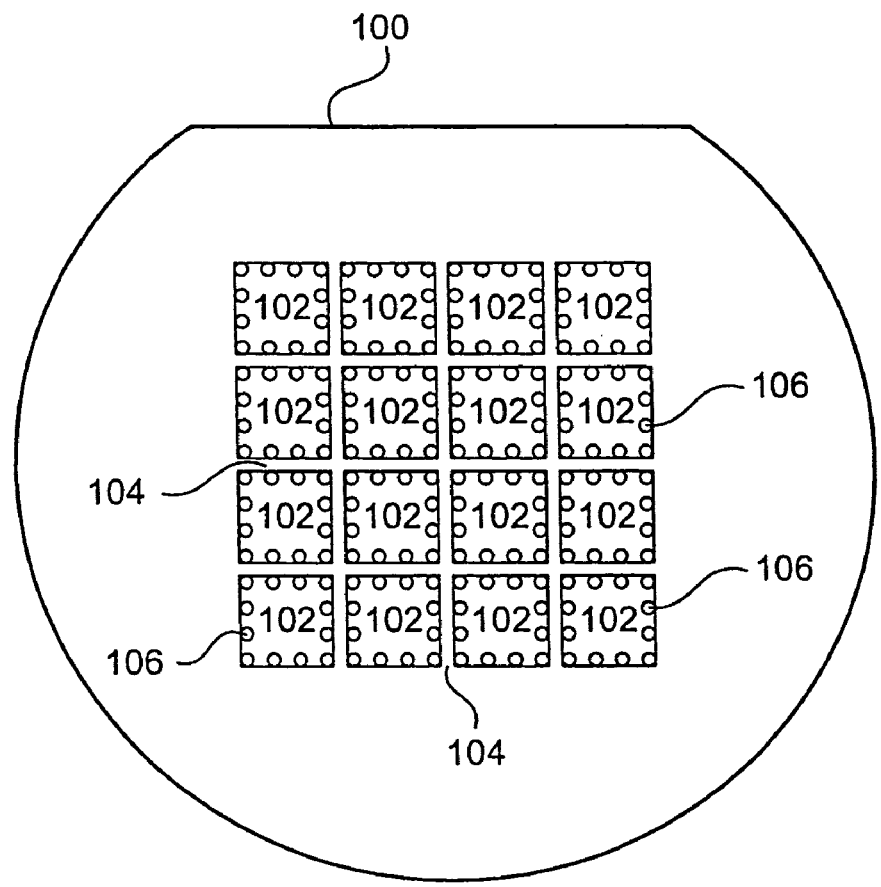
FIG. 1(a) is diagrammatic top view of a wafer with surface mount semiconductor dice fabricated thereon.

Referring to FIG. 1(a), a wafer with surface mount semiconductor dice fabricated thereon is illustrated. The wafer 100 includes a plurality of surface mount dice 102 (hereafter "die" or "dice") separated by horizontal and vertical scribe lines 104. Each of the die 102 include a plurality of solder contact balls 106 which are intended to be mounted directly onto contact pads of a substrate such as a printed circuit board. It should be noted that for clarity, only a relatively small number of dice 102 are shown on the wafer 100. In actuality, most wafers will have significantly more dice formed thereon. By way of example, current state of the art wafers typically have several hundred to several thousand dice formed thereon and some have more than ten thousand dice. As is well known in the art, most wafers are formed of silicon but they can, of course, be formed of any other appropriate semiconductor material including, for example, gallium arsenide (GaAs), Indium Gallium Phosphide, Silicon Germanium, etc.

Figure 1B:
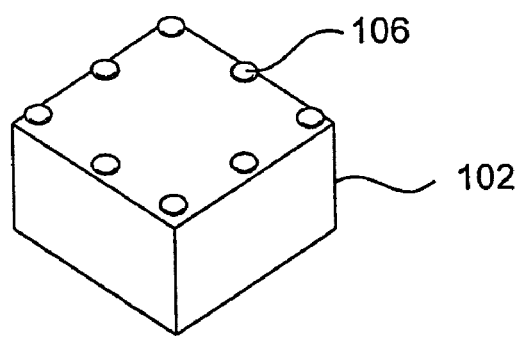
FIG. 1(b) is perspective view of a surface mount semiconductor die scribed from the wafer of FIG. 1(a).

Referring to FIG. 1(b), an individual die 102 scribed from the wafer of FIG. 1(a) is shown. After the wafer 100 is fabricated and contact balls 106 are formed thereon, a dicing machine is used to singulate the individual die 102 by sawing the wafer 100 along the scribe lines 104. In the embodiment shown, only one "row" or "ring" of contacts is provided on the die. However, in some embodiments other contact patterns including, for example, multiple rows, multiple rings, or arrays of contacts may be provided.

Figure 2A:
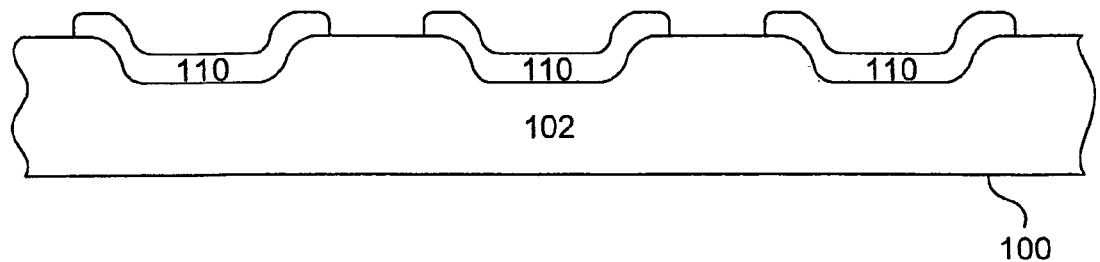
FIGS. 2(a) through 2(c) are a series of cross-section figures illustrating how solder balls are formed on the active surface of the wafer of FIG. 1(a) respectively.
Figure 2B:
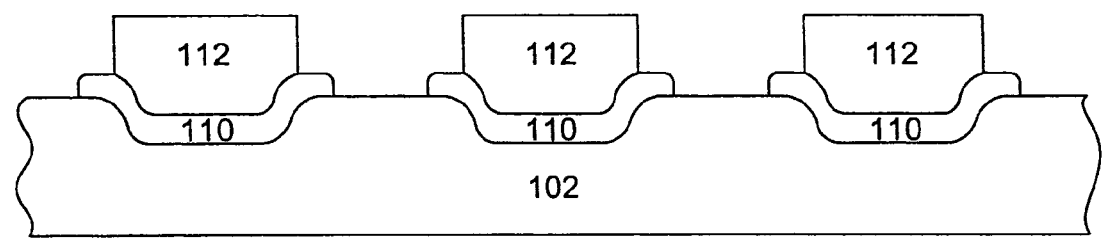
Figure 2C:
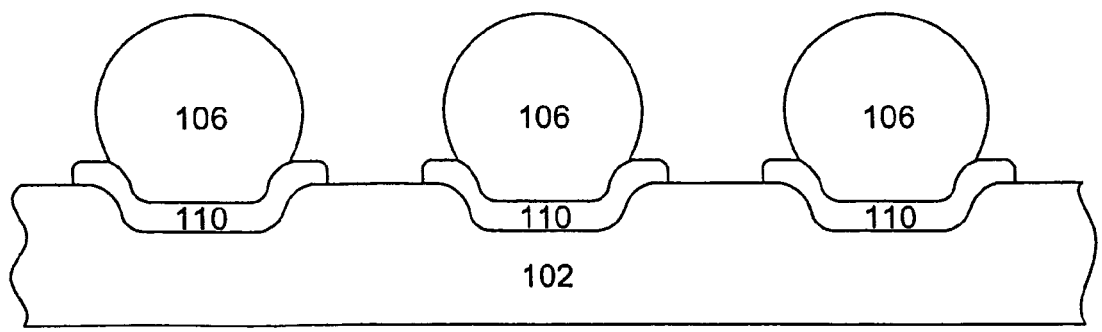

Referring to FIGS. 2(a) through 2(c), a series of partial cross-section figures of the wafer 100 illustrating how solder balls 106 are formed on the active surface of a die 102 is respectively shown. It should be noted that in the following description, numerous specific details are set forth in order to provide a thorough understanding of the present invention. In view of this description, however, it will be obvious to those skilled in the art that the present invention may be embodied in a wide variety of specific configurations. Also, in order not to unnecessarily obscure the present invention, well-known integrated circuit manufacturing steps are not described herein in detail.

In the initial step as illustrated in FIG. 2(a), a number of underbump metallization pads 110 are formed on the surface of the die 102. The underbump metallization pads 110 may be formed by a number of conventional processes. For example, one or more layer of conductive metal may be applied on the surface of the die 102. Most underbump metallization pads 110 are composed of between one and three metal layers as is well known by those familiar with the art. After the metal layer(s) have been deposited, the surface is then masked and etched, leaving the pads 110.

As illustrated in FIG. 2(b), solder paste islands 112 are formed on the pads 110. After the solder paste islands 112 are in place, corresponding solder balls 106 are formed by heating the wafer 100 causing the solder to reflow forming the solder balls 106. The resulting structure is illustrated in FIG. 2(c). It is useful to note that the "bowl-like" shaped underbump metallization pad 110 provides a barrier to the lateral flow of the solder paste during the reflow operation. The underbump metallization pad 110 also provides a barrier metal between the solder ball 106 and the interconnects within flip chip die 102.

In various embodiments of the invention, an underfill layer is applied to the wafer 100 before the wafer is diced. The underfill may be applied in a variety of different manners including, for example, stencil printing, screen printing, molding or spin coating. In many embodiments, a B-stageable adhesive material (such as a B-stageable epoxy) is used to form the underfill material. Typically, the wafer 100 will have solder balls 106 formed on the pads 110 before the underfill material is applied. When a B-stageable underfill adhesive material is used, the underfill layer may be only partially cured after being applied. Alternatively, the underfill layer may be fully cured using either a B-stageable material or other suitable underfills. In either state, the wafer 100 can be readily handled and diced thereby singulating the individual die 102. The resulting dice 102 can then be secured to any suitable substrate (such as printed circuit boards, package substrates, etc.) using conventional solder reflow techniques. In situations where the underfill material is only partially cured, the properties of the underfill adhesive may be chosen so that the reflowing of the solder contacts during mounting finally cures the underfill adhesive. In other embodiments of the invention, a B-stageable (or non-B-stageable) underfill adhesive can be applied to the active surface of the wafer and then fully cured.

More specifically, after the solder balls 106 have been formed, a layer of underfill is applied across the wafer 100. As noted, the underfill adhesive may be applied using a wide variety of techniques including stencil printing, screen printing, molding or spin-on processes. Each technique for applying underfill has advantages and disadvantages. By way example, molding works well and uses readily available equipment. As described in the previously referenced patent No. U.S. Pat. No. 6,245,595, the balls 106 are typically (although not always) flattened in the molding operation which can be an advantage or a disadvantage depending on the application. Screen printing allows the application of variable thickness coatings using inexpensive tooling screens. Typically, when screen printing is used, a relatively low to medium solvent-based resin formulation may be used as the underfill material. Stencil printing tends to provide better height control than screen printing, although the stencils tend to be more expensive than screens. As is well known to those familiar with the art, stencils used in conventional stencil printing operations typically have a relatively large opening in a relatively rigid sheet of material such as metal. The opening(s) is/are shaped to match that of the area(s) being printed. Otherwise, stencil printing is quite similar to screen printing. Typically underfill material with somewhat higher solvent percentages are used during stencil printing than screen printing.

In one embodiment of the invention, an underfill material having the following properties is used: viscosity: 2,000 to 10,000 mPa·s (milli Pascal.second); specific gravity: 1.0 to 1.2; solvent content: 20 to 45% (by weight); B-stage cure time of 20 to 30 minutes at 100 to 130 degrees C. under vacuum; and filler content: 1–10% (by weight). Solvent is added mainly to control the viscosity of the formulation, which includes epoxy resin, hardener, initiators (catalysts), dye (for color), and inorganic fillers. Key desirable properties of the underfill are: high glass transition temperature (Tg), low coefficient of thermal expansion (CTE), and good adhesion. High Tg material allows the underfill material to go through high temperature reflow with low risk of coating damage. High Tg materials are also obtainable through high molecular weight resins. Low CTE property is obtained through high filler loading. A preferred loading concentration aims to produce materials with CTEs between that of silicon ($3 \times 10^{-6}$ ppm/C) and the substrate ($15 \times 10$-6 ppm/C) the die will be mounted on. Both options (high Tg and low CTE) tend to raise the viscosity of the formulation, and can be controlled by adding solvent.

By way of example, an underfill material having a coefficient of thermal expansion in the range of approximately $20 \times 10^{-6}$/K to approximately $30 \times 10^{-6}$/K @ 25° C., was found to work well in order to reduce thermally induced stress. The coefficient of thermal expansion value of typical solders is also in this range. Close agreement between the CTE values of these materials minimizes the generation of shear stresses between the underfill and the solder joints.

One advantage to reducing thermal stress is that the overall reliability of the electrical connection formed by the solder joint is greatly enhanced.

In one specific embodiment, an underfill material having a solvent content of 40% is used. The observed advantages of using this percentage include: a lower viscosity so that flow coverage over the solder bumps and wafer passivation is enhanced; lower potential for air entrapment during coating; a lower incidence of microscopic voiding trapped at the base of the solder bumps; and an optimized B-stage curing profile. Too much solvent does not allow for proper flow.

With the use of an underfill material with the above-defined characteristics, the applicants have found much of the solvent tends to evaporate during the curing process. Thus, the initial thickness of the underfill layer applied to the active surface of the wafer 100 needs to take into account the reduction in thickness due to solvent loss. In this example, the applicants have found that in order to produce a layer of underfill having a thickness that has a height substantially the same as the solder balls 106, the pre-curing thickness of the material needs to be approximately 140% of the height of the solder balls 106. In various other embodiments of the invention, an underfill material with a lower solvent content may be used. With the solvent content lower, the amount of solvent loss will be less. Therefore, the height of the pre-cured underfill layer needs to be selected so that the final cure height is at the desired level, typically at a height such that at least the top surface of the solder balls 106 are exposed.

Figure 3A:
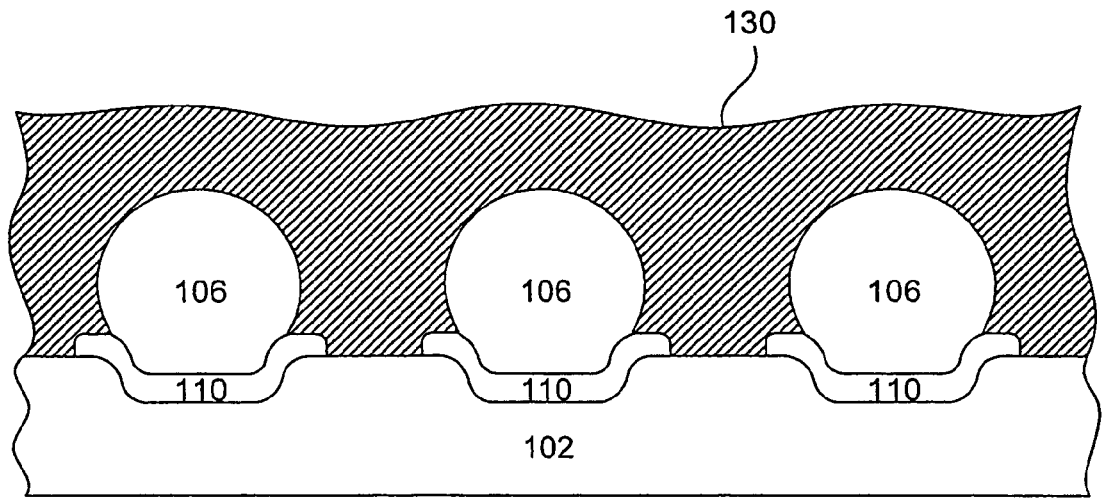
FIGS. 3(a) and 3(b) illustrate partial cross sections of the wafer of FIG. 1(a) showing a pre-cured and a partially cured underfill layer respectively according to one embodiment of the invention.
Figure 3B:
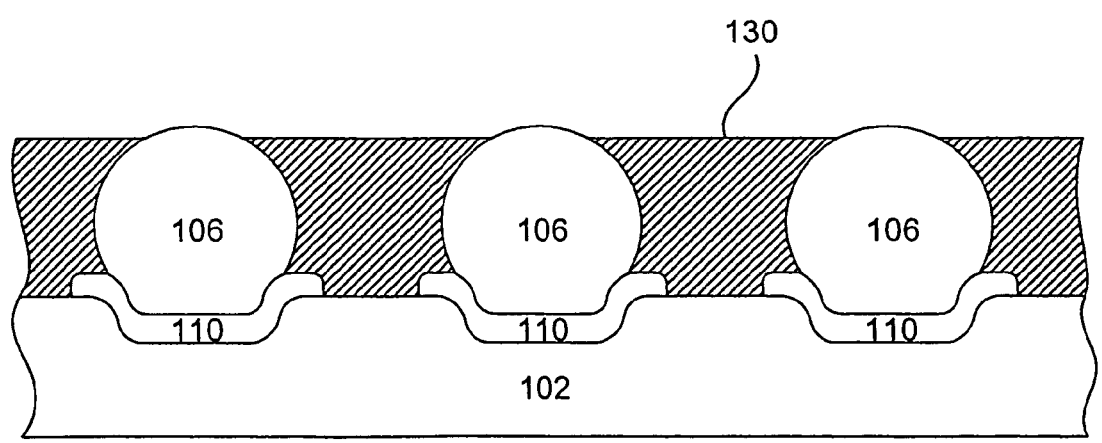

Referring to FIGS. 3(*a*) and 3(*b*), partial cross sections with underfill material provided across the active surface of the wafer 100 are shown. In FIG. 3(*a*), the height of the underfill material 130 applied during screen printing is illustrated as being well above the solder balls, as for example, a height of 120–140% of the solder balls 106. More generally initial (precure) underfill layer heights in the range of 90–140% of the solder ball heights have been found to work well with relatively high solvent content underfill materials. The wafer is then heated to pre-cure the underfill material, which drives off a significant percentage of the solvents thereby reducing the height of the underfill material, which exposes at least the top surface of the solder balls 106 as best seen in FIG. 3(*b*). It should be noted however, that this embodiment in no way should limit the scope of the invention. The pre-cure and post-cure height can be either higher or lower than those illustrated in these figures according to various embodiments of the invention.

In some embodiments of the invention, the underfill layer 130 is formed of a silica filled polymer resin having dual stage curing chemistry with specific, uncured, pre-cured, and fully cured properties. Examples of such a resin include: epoxy based, poly-imide based, or silicone-polyimide based materials.

The layer of underfill adhesive may be substantially opaque to protect the integrated circuitry on the die 102 from photo induced leakage currents by blocking visible light. The percentage of filler and the amount of dye included in the underfill adhesive 130 can be modified to control the opaqueness of the material.

As discussed above, in the currently described embodiments, the underfill material is preferably formed from a B-stageable adhesive. The B-stage underfill may be tailored to meet the needs of the particular application. By way of example in one described embodiment, the B-stage underfill is tailored so that it starts melting at around 130° C. and begins reacting after 183° C. (the melting temperature of eutectic Tin-Lead solder). The underfill may be designed so that is reaches about 90%+cure by the time that the die cool down from would typically a second solder ball reflow. In this embodiment, the 90% cure is considered acceptable and the assembled die mounted onto a substrate does not have to be post cured, which is a benefit of the process. Of course, in other embodiments, the melting and reaction temperatures, as well as the target cure percentage may all be modified to meet the needs of a particular application.

Once the underfill material is cured, it should have specific thermal and mechanical properties to reduce the effects of thermal stresses without adversely affecting thermal performance of the flip chip. The cured underfill material should typically have an elastic modulus in the range of 1 to 10 GPa. A mismatch between the coefficient of thermal expansion of the flip chip and the substrate on which the flip chip is attached exerts a shear stress on the solder joint. One function of the underfill is to provide additional (high strength) material in the plane of the solder joints across which the stresses can be distributed. Modulus values in the range 1 to 10 GPa as specified above allow the underfill to distribute these stresses without exceeding the fracture strength of the silicon.

The underfill material 130 may be self-fluxing, e.g., it may already have a small amount of flux added to the epoxy base resin to eliminate solder oxide during reflow and allow proper wetting of the pads on the substrate. When the packages were placed on the substrate pads to go directly into the reflow oven for board mounting, it was discovered that small perturbations (e.g., vibration from the conveyor belt, convection currents inside the oven, etc.) can displace the packages that had been carefully aligned. As a result, the packages may not be properly connected resulting in bad yield. For standard flip chip or array-based chip scale packages, as well as embodiments having lower underfill levels (and thus more exposed solder balls) this can be corrected mostly from the self alignment properties of the solder. With thick pre-applied underfill layers, however, self-alignment is much more restricted. Best results were achieved in devices having thick underfill layers when a small amount of flux was dispensed on the substrate first, prior to the pick and place of the device. The sticky flux acts as a "glue" to hold down the package while being reflowed. As a result, higher assembly yields were obtained. The addition of the flux needs to be considered in the formulation of the self-fluxing underfill, since too much flux will affect the final properties of the underfill. (Flux is composed of low molecular weight materials, and will decrease the glass transition temperature of the underfill, affecting long term thermal cycling performance).

Furthermore with standard pick and place equipment, the vision system can rely on either the solder bumps or the outline of the package as fiducials for referencing. Accurate placement usually requires using the solder bumps. The die outline may be influenced by the quality of the dicing operation. Any chipping of the edge will affect the vision recognition, and impact the placement accuracy. The underfill coating may affect the vision system on some pick and place machines, resulting in poor placement accuracy. In some cases, this can be resolved by adjusting the lighting conditions (e.g., intensity, beam direction, etc.). In other cases, however, the coating will seem to mask the bumps, and as a result, the die outline will have to be used for pick and place of the package. Best results were achieved with underfill coatings that are level with or below the solder bumps in their partially cured state, since in this case, the outlines of the bumps can be identified.

FIG. 4 illustrates a flip chip die of the present invention mounted to a substrate such as a printed circuit board. Note the underfill material 130 forms fillets 132 after final curing.

For good solder joint reliability performance, it is often desirable to pre-print solder paste on the substrate to which the die is attached. Indeed many conventional production processes apply solder paste to the substrate landings that the flip chip dice are secured to. During reflow, the solder paste will add to the original solder ball volume, effectively increasing the solder volume and height of the final interconnect. Most conventional solder pastes are quite soft (e.g., they may have a viscosity that is relatively similar to the viscosity of toothpaste) and thus the paste may be readily squished or otherwise moved or deformed. When the height of the underfill material is chosen so that the intermediate (partially cured) underfill height (i.e., the height prior to the solder ball reflow that occurs when mounting the flip chip die), is close to the same thickness (or thicker) than the solder balls, the filler material can cause the solder in the solder paste to spread beyond the intended area. Some of this effect appears to be due to the placement of a relatively flat surfaced device directly on the substrate which may cause some initial squeezing of the solder paste.

Additionally, it has been observed that the use of fillers within the underfill may cause streaking of the solder paste in some cases. This is particularly a problem when underfill materials having significant amounts of filler material (e.g. silica balls) are used. It is also believed that during reflow, the filler material sometimes tends to catch some of the solder in the solder paste and carry it away from the intended solder joint resulting in streaking. More specifically, when the underfill material liquefies during reflow, certain fillers (e.g. silica balls) tend to entrain the solder paste powder, and move them away from the pads causing the streaking. In some of the worst cases the described spreading and streaking may cause shorting of the contacts but in any event, they tends to result in decreased yields. This problem can be addressed by preflowing the solder paste prior to die attachment. This can readily be done in manufacturing. However, in practice, altering the die attach process is not always practical because many assemblers will be reluctant to make such a modification. In these situations, more exposed solder ball embodiments can be used. A second described embodiment addresses this problem in the application of the underfill material.

Figure 5A:
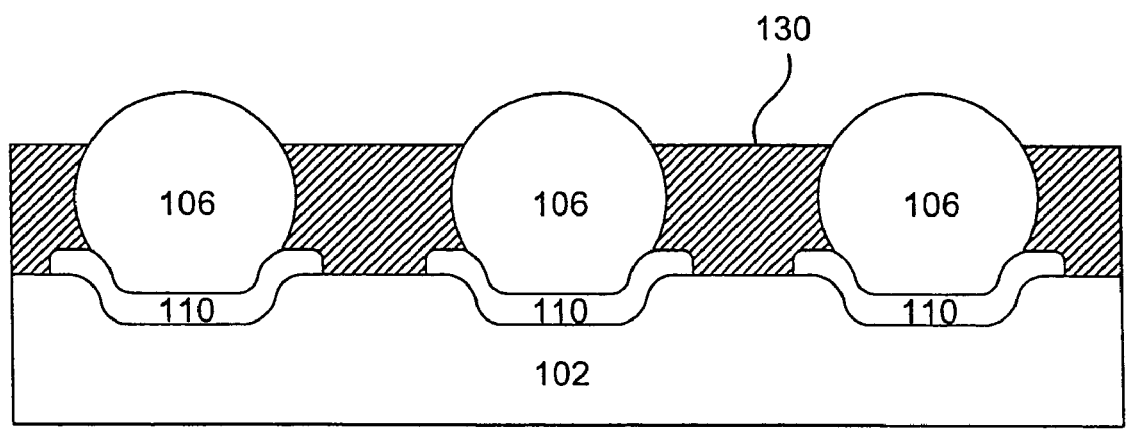
FIG. 5(a) is a cross sectional side view of a partially cured underfilled wafer having more exposed solder bumps in accordance with a second embodiment of the present invention.

In the second described embodiment, the bumped wafer is coated with a thinner layer of underfill material, as for example by using intermediate underfill thicknesses in the range of 60–80 percent of the thickness of the solder balls. In particular, B-stageable underfill materials having relatively high solvent content and low to no filler may be used in this application. By way of example, epoxy-based underfill materials available from NS&C of New Jersey has been found to work well. As best seen in FIG. 5(a), the thinner layer of underfill, leaves more of the balls exposed.

When a standard surface mount assembly technique is used wherein solder paste is applied to the substrate metal pads, the solder balls press neatly into the solder paste and the underfill material does not unduly deform the solder paste. This is illustrated in FIG. 5(b). When the solder is heated, the solder paste is melted, the solder balls reflow and the B-stageable material softens, flows around the solder joints and then more fully cures. When the proper underfill height is chosen, a good bond is formed between the die and the substrate and a good fillet forms to the side of the die as illustrated in FIG. 5(c). By way of example, when material from NS&C is used, an intermediate underfill material thickness of approximately 70% of the height of the solder balls has been found to work well and to form good fillets to the sides of the mounted die. It should be appreciated, however, that the optimal thickness of the underfill material will vary depending upon the characteristics of the underfill material used and other process variables. When a low solvent material is used, the initial thickness of the deposited underfill material may be only slightly higher than the intermediate thickness. By way of example, when NS&C's wafer-level underfill material is used, an original thickness of approximately 100% of the solder ball height may result in an intermediate thickness of approximately 70% of the solder ball height.

The second described embodiment has a number of potential advantages over the first described embodiment. One of the primary advantages is that it can readily be used with standard surface mount technology assembly processes that are most popular today, without requiring any modifications of the production line. For example, it works in full compatitiblity with solder paste printing. It does not require a separate flux dispense on the PCB or package during assembly. Most existing vision systems can generally readily recognize the bumps and the packages can readily be handled by existing pick and place equipment. Additionally, the dice may be readily tested even after the underfill material has been applied.

In still another very different embodiment, a relatively thinner undercoating is applied to the active surface of the wafer. In this embodiment, the coating is fully cured at the wafer level. Such a coating does not act as an underfill material, but it does serve to reinforce the solder balls which can help solder joint reliability. The undercoating may be formed from epoxy or other suitable material and may be a variety of heights. By way of example, undercoating heights in the range of approximately 30–70% of the solder ball height have been found to work well in this application.

Figure 6A:
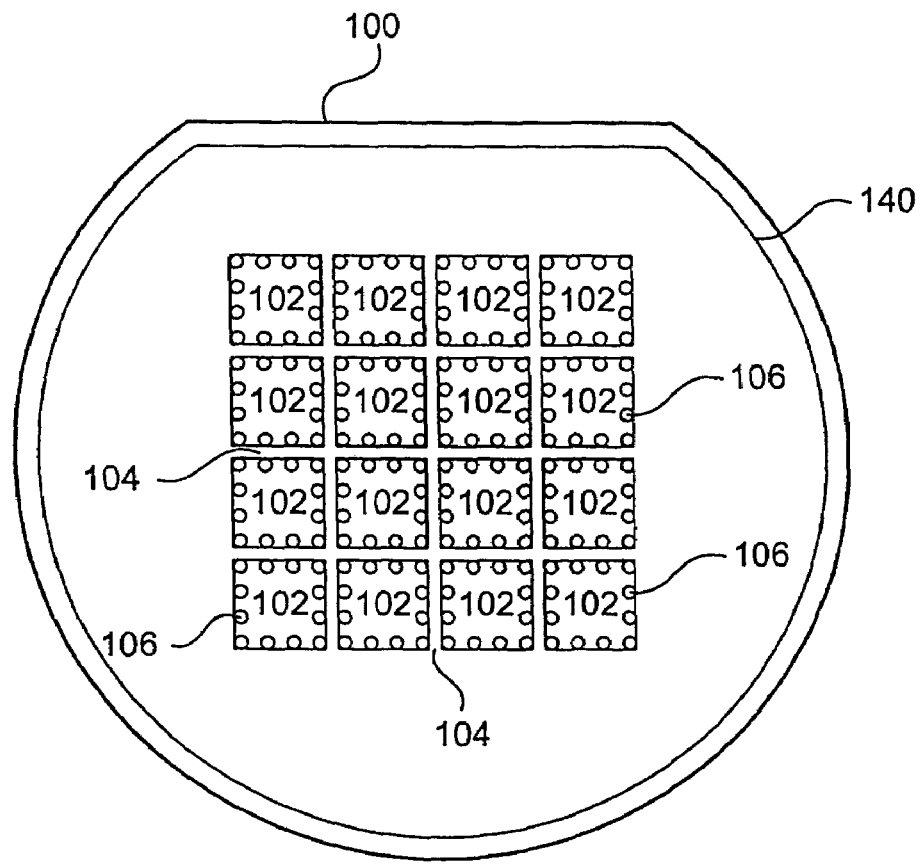
FIG. 6(a) and FIG. 6(b) are top and cross sectional views of a wafer having a dam according to yet another embodiment.
Figure 6B:
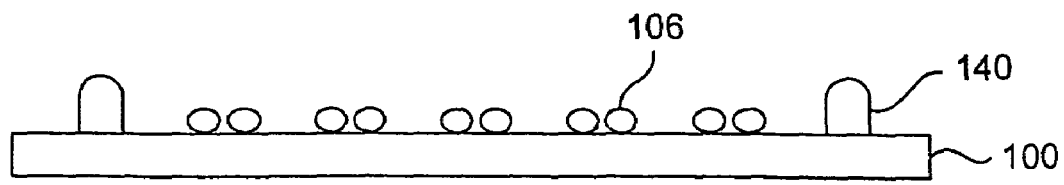

Referring to FIGS. 6(a) and 6(b), a top view and a cross section view of wafer 100 according to another embodiment of the invention are shown. In this embodiment, a dam 140 is provided around the outer periphery of the wafer 100. The purpose of the dam is to prevent pre-cured underfill material from dripping or flowing off the wafer 100 after being dispensed onto the wafer. According to various embodiments, the height of the dam 140 can be varied to equal or exceed the thickness of the underfill material 130 applied to the wafer 100. The dam 140 can also be made of a variety of materials, for example a low viscosity cured epoxy.

Although only a few embodiments of the present invention have been described in detail, it should be understood that the present invention may be embodied in many other specific forms without departing from the spirit or scope of the invention. Most notably the composition of the underfill material may be widely varied and the initial (pre-cure) as well as the intermediate (partially cured) heights of the underfill may be widely varied. By way of example, when high solvent filler materials are used, pre-cure heights on the order of 90–140% of the solder ball height may be used. When lower solvent filler materials are used, lower pre-cure heights may be appropriate. In some cases the partially cured underfill layer may completely cover or only slightly expose the solder balls. However, in many cases it will be desirable to leave 20–40% of the ball height exposed to mesh better with particular production processes. In still other embodiments even more of the solder balls may be left exposed, although this detracts from the ability to use the undercoating as a true underfill material. Although these representative numbers have been used to better explain some of the characteristics of various features of the invention, it should be appreciated that the actual pre-cure and partial cure underfill layer heights may be widely varied without departing from the spirit of the invention.

The underfill layers may be applied using a variety of techniques including stencil printing, screen printing, molding and spin on processes. In some embodiments, it may be desirable to mask the underfill material away from the saw streets as described in the parent application Ser. No. 09/359, 214, which is incorporated herein by reference, although this technique is not generally favored. Therefore, the present examples are to be considered as illustrative and not restrictive, and the invention is not to be limited to the details given herein but may be modified within the scope of the appended claims.

The invention claimed is:

1. A method, comprising:
fabricating a plurality of integrated circuit dice on an active surface of a wafer;
fabricating one or more electrically conductive pads on each of the dice on the active surface of the wafer respectively;
forming solder bumps on the one or more electrically conductive pads on each of the dice on the active surface of the wafer respectively;
applying a layer of underfill adhesive on the active surface of the wafer, the layer of underfill covering the plurality of integrated circuit dice on the active surface of the wafer; and
partially curing the layer of underfill adhesive applied to the active surface of the wafer,
wherein the curing the underfill adhesive after depositing the underfill involves only partially curing the underfill adhesive without fully curing the underfill adhesive so that the underfill adhesive may be further cured when the associated solder bumps are reflowed to electrically connect the integrated circuit dice to substrates respectively wherein the underfill adhesive includes at least once of the following properties: a specificity of gravity ranging from 1.0 to 1.2; a solvent content ranging from 20% to 40% a cure time of 20 to 30 minutes at 100 to 130 degrees C.; and a filler content of 1% to 10% by weight.

2. The method as recited in claim 1 further comprising singulating the integrated circuits from the wafer wherein at least one of the singulated integrated circuits is a flip chip integrated circuit suitable for encapsulation in a flip chip package.

3. The method as recited in claim 2, further comprising:
aligning selected ones of the solder bumps of the flip chip to corresponding bond pads included on a substrate upon which the flip chip is to be mounted;
mounting the flip chip integrated circuit on the substrate such that each of the selected solder bumps are in direct contact with the corresponding substrate bond pad;
reflowing the solder bumps such that the flip chip bond pads are electrically connected to the corresponding substrate bond pads; and
fully curing the underfill adhesive during the reflow of the solder bumps.

4. The method of claim 3, wherein a solder paste is provided on the bond pads of the substrate prior to mounting the flip chip.

5. The method of claim 3, wherein a fluxing material is provided on the substrate prior to mounting the flip chip.

6. The method of claim 1, wherein the underfill adhesive includes one or more of the following components: an epoxy resin, a hardener, a catalyst initiator, a coloring dye, and an inorganic filler.

7. The method of claim 1, wherein the underfill adhesive has a coefficient of thermal expansion substantially similar to a substrate or external device upon which the integrated circuits are mounted.

8. The method of claim 1, wherein the underfill adhesive is applied on the active surface of the wafer at a pre-cured height such that the solder bumps are exposed through the underfill adhesive after the partial curing.

9. The method of claim 8, wherein the pre-cured height of the underfill adhesive applied to the wafer ranges from 140% to 90% of the height of the solder bumps.

10. A method as recited in claim 1, wherein the underfill material is applied using stencil printing.

11. A method as recited in claim 1, wherein the underfill material is applied using one selected from the group consisting of screen printing, molding and spin-on deposition processes.

12. A method as recited in claim 1, wherein the underfill adhesive is selected from the group comprising: epoxies, poly-imides, silicone-polyimide copolymers.

13. The method of claim 1, wherein the underfill adhesive has a coefficient of thermal expansion in the range of approximately $20 \times 10^{-6}$/K to approximately $30 \times 10^{-6}$/K @25° c.

14. The method of claim 1, wherein the underfill adhesive melts at between 120 to 140 degrees C. and reacts at between 175 to 195 degrees C.

15. The method of claim 1, wherein the underfill adhesive has an elastic modulous in the range of 1 to 10 GPa.

16. The method of claim 1, further comprising forming a dam around the periphery of the wafer to prevent the underfill material deposited onto the active surface of the wafer from flowing off the wafer before the partial curing of the adhesive layer.

17. A method as recited in claim 1, wherein the height of the underfill material after the partial curing is in the range of approximately 60–80% of the height of the solder balls.

18. A method as recited in claim 1 wherein the underfill material after the partial curing is no more than approximately 70% of the height of the solder balls.

19. A method, comprising:
fabricating a plurality of integrated circuit dice on an active surface of a wafer;
fabricating one or more electrically conductive pads on each of the dice on the active surface of the wafer respectively;
forming solder bumps on the one or more electrically conductive pads on each of the dice on the active surface of the wafer respectively;
after forming the solder bumps, applying a layer of underfill adhesive on the active surface of the wafer, the layer of underfill covering the plurality of integrated circuit dice on the active surface of the wafer; and
partially curing the layer of underfill adhesive applied to the active surface of the wafer,
wherein the curing the underfill adhesive after depositing the underfill involves only partially curing the underfill adhesive without fully curing the underfill adhesive so that the underfill adhesive may be further cured when the associated solder bumps are reflowed to electrically connect the integrated circuit dice to substrates respectively wherein the underfill adhesive includes at least once of the following properties: a specificity of gravity ranging from 1.0 to 1.2; a solvent content ranging from 20% to 40% a cure time of 20 to 30 minutes at 100 to 130 degrees C.; and a filler content of 1% to 10% by weight.

20. The method as recited in claim 19 further comprising singulating the integrated circuits from the wafer wherein at least one of the singulated integrated circuits is a flip chip integrated circuit suitable for encapsulation in a flip chip package.

21. The method as recited in claim 20, further comprising:
aligning selected ones of the solder bumps of the flip chip to corresponding bond pads included on a substrate upon which the flip chip is to be mounted;
mounting the flip chip integrated circuit on the substrate such that each of the selected solder bumps are in direct contact with the corresponding substrate bond pad;
reflowing the solder bumps such that the flip chip bond pads are electrically connected to the corresponding substrate bond pads; and
fully curing the underfill adhesive during the reflow of the solder bumps.

22. The method of claim 19, wherein the underfill adhesive includes one or more of the following components: an epoxy resin, a hardener, a catalyst initiator, a coloring dye, and an inorganic filler.

23. The method of claim 19, wherein the underfill adhesive has a coefficient of thermal expansion substantially similar to a substrate or external device upon which the integrated circuits are mounted.

24. The method of claim 19, wherein the underfill adhesive is applied on the active surface of the wafer at a pre-cured height such that the solder bumps are exposed through the underfill adhesive after the partial curing.

25. The method of claim 24, wherein the pre-cured height of the underfill adhesive applied to the wafer Yes from 140% to 90% of the height of the solder bumps.

26. A method as recited in claim 19, wherein the underfill material is applied using one selected from the group consisting of screen printing, molding and spin-on deposition processes, or stencil printing.

27. A method as recited in claim 19, wherein the underfill adhesive is selected from the group comprising: epoxies, poly-imides, silicone-polyimide copolymers.

28. The method of claim 19, wherein the underfill adhesive has a coefficient of thermal expansion in the range of approximately $20 \times 10^{-6}$/K to approximately $30 \times 10^{-6}$/K @ 25° C.

29. The method of claim 19, wherein the underfill adhesive melts at between 120 to 140 degrees C. and reacts at between 175 to 195 degrees C.

30. The method of claim 19, wherein the underfill adhesive has an elastic modulous in the range of 1 to 10 GPa.

31. A method as recited in claim 19, wherein the height of the underfill material after the partial curing is in the range of approximately 60–80% of the height of the solder balls.

32. A method as recited in claim 19, wherein the underfill material after the partial curing is no more than approximately 70% of the height of the solder balls.

* * * * *

UNITED STATES PATENT AND TRADEMARK OFFICE
CERTIFICATE OF CORRECTION

| | | |
|---|---|---|
| PATENT NO. | : 7,253,078 B1 | Page 1 of 1 |
| APPLICATION NO. | : 10/224291 | |
| DATED | : August 7, 2007 | |
| INVENTOR(S) | : Nguyen et al. | |

It is certified that error appears in the above-identified patent and that said Letters Patent is hereby corrected as shown below:

Title Page;

[75] INVENTORS:

Inventor Luu T. Nguyen - delete "Sunnyvale" and insert --San Jose--.

CLAIMS:

1. In line 40 of claim 1 (column 9, line 40) change "once" to --one--.

2. In line 67 of claim 19 (column 10, line 67) change "once" to --one--.

Signed and Sealed this

Fourteenth Day of October, 2008

JON W. DUDAS
*Director of the United States Patent and Trademark Office*